United States Patent
Kojima

(10) Patent No.: US 8,497,722 B2
(45) Date of Patent: Jul. 30, 2013

(54) SR FLIP-FLOP

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 38 days.

(21) Appl. No.: 13/335,458

(22) Filed: Dec. 22, 2011

(65) Prior Publication Data

US 2012/0161840 A1     Jun. 28, 2012

(30) Foreign Application Priority Data

Dec. 27, 2010   (JP) ................................. 2010-290245

(51) Int. Cl.
    *H03K 3/00*     (2006.01)

(52) U.S. Cl.
    USPC .......................... 327/217; 327/198; 327/184

(58) Field of Classification Search
    USPC ...................................................... 327/217
    See application file for complete search history.

(56) References Cited

U.S. PATENT DOCUMENTS

| | | | | |
|---|---|---|---|---|
| 3,971,960 A * | 7/1976 | Means et al. | ................... | 327/198 |
| 4,728,823 A * | 3/1988 | Kinoshita | ........................ | 326/41 |
| 5,095,225 A * | 3/1992 | Usui | ............................... | 327/211 |
| 5,710,744 A | 1/1998 | Suda | ............................. | 368/120 |
| 6,549,050 B1 * | 4/2003 | Meyers et al. | ................. | 327/217 |
| 6,657,472 B1 | 12/2003 | Raza et al. | ..................... | 327/217 |
| 7,852,119 B1 * | 12/2010 | Kojima | .......................... | 326/81 |
| 2011/0166819 A1 * | 7/2011 | Kojima | .......................... | 702/120 |

* cited by examiner

*Primary Examiner* — Jany Richardson
(74) *Attorney, Agent, or Firm* — Ladas & Parry LLP

(57) ABSTRACT

An input priority determination circuit is configured such that: (i) when a set signal S is asserted and a reset signal R is negated, an intermediate set signal S' is asserted and an intermediate reset signal R' is negated; (ii) when the set signal S is negated and the reset signal R is asserted, the intermediate set signal S' is negated, and the intermediate reset signal R' is asserted; (iii) when a control signal P indicates a set priority mode, and when the set signal S and the reset signal R are both asserted, the intermediate set signal S' is asserted and the intermediate reset signal R' is negated; and (iv) when the control signal P indicates a reset priority mode, and when the set signal S and the reset signal R are both asserted, the intermediate set signal S' is negated and the intermediate reset signal R' is asserted.

12 Claims, 10 Drawing Sheets

FIG.3

| S | R | P | S' | R' | Q | QX | STATE |
|---|---|---|----|----|---|----|----|
| 0 | 0 | φ | 0 | 0 | Q | #Q | HOLD |
| 0 | 1 | φ | 0 | 1 | 0 | 1 | RESET |
| 1 | 0 | φ | 1 | 0 | 1 | 0 | SET |
| 1 | 1 | 0 | 0 | 1 | 0 | 1 | RESET |
| 1 | 1 | 1 | 1 | 0 | 1 | 0 | SET |

A

B

| S | R | P | SB | RB | S' | R' |
|---|---|---|----|----|----|----|
| 0 | 0 | 1 | 1  | 1  | 0  | 0  |
| 0 | 1 | 1 | 1  | 0  | 0  | 1  |
| 1 | 0 | 1 | 0  | 1  | 1  | 0  |
| 1 | 1 | 1 | 0  | 1  | 1  | 0  |

| S | R | P | SB | RB | S' | R' |
|---|---|---|----|----|----|----|
| 0 | 0 | 0 | 1  | 1  | 0  | 0  |
| 0 | 1 | 0 | 1  | 0  | 0  | 1  |
| 1 | 0 | 0 | 0  | 1  | 1  | 0  |
| 1 | 1 | 0 | 1  | 0  | 0  | 1  |

100a

| S | R | P | SD | RD | SB' | RB' | Q | QX |
|---|---|---|----|----|----|----|----|----|
| 0 | 0 | 0 | 1 | 1 | 1 | 1 | Q | #Q |
| 0 | 1 | 0 | 0 | 1 | 1 | 0 | 0 | 1 |
| 1 | 0 | 0 | 1 | 1 | 0 | 1 | 1 | 0 |
| 1 | 1 | 0 | 0 | 1 | 1 | 0 | 0 | 1 |
| 0 | 0 | 1 | 1 | 1 | 1 | 1 | Q | #Q |
| 0 | 1 | 1 | 1 | 1 | 1 | 0 | 0 | 1 |
| 1 | 0 | 1 | 1 | 0 | 0 | 1 | 1 | 0 |
| 1 | 1 | 1 | 1 | 0 | 0 | 1 | 1 | 0 |

SR FLIP-FLOP

CROSS-REFERENCE TO RELATED APPLICATIONS

This application claims to priority to Japanese Patent Application No. 2010-290245 filed on Dec. 27, 2010 the disclosure of which is incorporated herein by reference.

BACKGROUND OF THE INVENTION

1. Field of the Invention

The present invention relates to an SR flip-flop.

2. Description of the Related Art

In digital circuits, SR flip-flops are widely employed. An SR flip-flop includes a set terminal and a reset terminal, and is configured to output, via its output terminal, an output signal that corresponds to a set signal and a reset signal input to the set terminal and the reset terminal. When the set signal is asserted (set to high level, for example), the SR flip-flop sets a positive logic output (which will be referred to as "non-inverted output", or otherwise simply as "output") Q to a first level (e.g., high level) at each positive edge timing of the set signal. When the reset signal is asserted, the SR flip-flop sets the output Q to a second level (e.g., low level) at each positive edge timing of the reset signal. The SR flip-flop is configured to output an inverted output #Q that is obtained by logical inversion of the output Q, in addition to the output Q.

Typical examples of such an SR flip-flop include: a NOR SR flip-flop including two cross-connected NOR (logical NOR) gates; and a NAND SR flip-flop including two cross-connected NAND (logical NAND) gates.

With such a NOR SR flip-flop or a NAND SR flip-flop, when the set terminal and the reset terminal are asserted at the same time, the positive logic output and the inverted output have the same level. In order to solve such a problem, such an input operation in which the set terminal and the reset terminal are asserted at the same time is inhibited.

Also, a set priority flip-flop and a reset priority flip-flop are known, which are configured such that, when the set terminal and the reset terminal are asserted at the same time, one of the two logic states is prioritized.

[Related Art Documents]
[Patent Documents]
[Patent Document 1]
U.S. Pat. No. 6,657,472B1 Specification
[Patent Document 2]
U.S. Pat. No. 5,710,744 Specification Such an SR flip-flop is employed in a semiconductor test apparatus shown in FIG. 1 of Patent document 2, for example. Such a flip-flop employed in such a semiconductor test apparatus is required to permit simultaneous assertion in which the set terminal and the reset terminal are asserted at the same time. Accordingly, there is a need to employ a set priority flip-flop or otherwise a reset priority flip-flop. However, with conventional set priority flip-flops or reset priority flip-flops, the prioritized input terminal is fixed. That is to say, once it is designed, the prioritized input terminal cannot be changed, which is a restriction in the design.

SUMMARY OF THE INVENTION

The present invention has been made in view of such a situation. Accordingly, it is an exemplary purpose of an embodiment of the present invention to provide an SR flip-flop which is capable of switching its mode between a set priority mode and a reset priority mode.

An embodiment of the present invention relates to a SR flip-flop configured to be capable of switching its input logic priority. The SR flip-flop comprises: an input set terminal configured to receive a set signal as an input signal; an input reset terminal configured to receive a reset signal as an input signal; a control terminal configured to receive, as an input signal, a control signal which is an instruction for the SR flip-flop to switch its mode between a set priority mode and a reset priority mode; an input priority determination circuit configured to receive the set signal, the reset signal, and the control signal, to generate an intermediate set signal and an intermediate reset signal; and an output SR flip-flop. The input priority determination circuit is configured to operate such that (i) when the set signal is asserted and the reset signal is negated, the intermediate set signal is asserted, and the intermediate reset signal is negated, (ii) when the set signal is negated and the reset signal is asserted, the intermediate set signal is negated, and the intermediate reset signal is asserted, (iii) when the control signal indicates the set priority mode, and when the set signal and the reset signal are both asserted, the intermediate set signal is asserted, and the intermediate reset signal is negated, and (iv) when the control signal indicates the reset priority mode, and when the set signal and the reset signal are both asserted, the intermediate set signal is negated, and the intermediate reset signal is asserted. The output SR flip-flop is configured to receive the intermediate set signal via its set terminal, to receive the intermediate reset signal via its reset terminal, and to operate such that (i) when the intermediate set signal is asserted, its positive logic output is asserted, and (ii) when the intermediate reset signal is asserted, its positive logic output is negated.

With such an embodiment, by switching the level of the control signal, the SR flip-flop can be switched between the set logic priority and the reset logic priority.

Also, the input priority determination circuit may comprise: a first inverter configured to invert the set signal; a second inverter configured to invert the reset signal; a first control unit configured to switch the state of the first inverter between an active state and an inactive state, and to operate such that, when the control signal indicates the set priority mode or when the output of the second inverter is high level, the first inverter is set to the active state; a second control unit configured to switch the state of the second inverter between an active state and an inactive state, and to operate such that, when the control signal indicates the reset priority mode or when the output of the first inverter is high level, the second inverter is set to the active state; a first pull-up circuit configured to pull up the output of the first inverter to high level when the control signal indicates the reset priority mode and the output of the second inverter is low level; and a second pull-up circuit configured to pull up the output of the second inverter to high level when the control signal indicates the set priority mode and the output of the first inverter is low level.

Also, the output SR flip-flop may have a positive logic input configuration. Also, the input priority determination circuit may further comprise: a fourth inverter configured to invert the output of the first inverter, and to output the signal thus inverted to the set terminal of the output SR flip-flop; and a fifth inverter configured to invert the output of the second inverter, and to output the signal thus inverted to the reset terminal of the output SR flip-flop.

Also, the output SR flip-flop may have a negative logic input configuration. Also, the input priority determination circuit may be configured to operate such that the output of the first inverter is output to the inverting set terminal of the output SR flip-flop, and such that the output of the second inverter is output to the inverting reset terminal of the output SR flip-flop.

Also, the input priority determination circuit may comprise: a sixth inverter configured to invert the control signal; a first NAND gate configured to generate the logical NAND of the reset signal and the output of the sixth inverter; a second NAND gate configured to generate the logical NAND of the set signal and the control signal; a third NAND gate configured to generate the logical NAND of the set signal and the output of the first NAND gate; and a fourth NAND gate configured to generate the logical NAND of the reset signal and the output of the second NAND gate.

Also, the input priority determination circuit may comprise: a seventh inverter configured to invert the control signal; a first OR gate configured to generate the logical OR of the control signal and the intermediate reset signal; a second OR gate configured to generate the logical OR of the output of the seventh inverter and the intermediate set signal; a fifth NAND gate configured to generate the logical NAND of the set signal and the output of the first OR gate; and a sixth NAND gate configured to generate the logical NAND of the reset signal and the output of the second OR gate.

Also, the output SR flip-flop may have a negative logic input configuration.

Another embodiment of the present invention also relates to an SR flip-flop configured to be capable of switching its logic priority. The SR flip-flop comprises: an input set terminal configured to receive a set signal as an input signal; an input reset terminal configured to receive a reset signal as an input signal; a control terminal configured to receive, as an input signal, a control signal which is an instruction for the SR flip-flop to switch its mode between a set priority mode and a reset priority mode; an input SR flip-flop configured to receive the set signal via its set terminal, and to receive the reset signal via its reset terminal; a selector configured to select one from among an output signal and an inverted output signal of the input SR flip-flop according to the control signal; an EXOR gate configured to generate the exclusive OR of the output of the selector and the control signal; and an eighth inverter configured to invert the output of the EXOR gate.

With such an embodiment, by switching the level of the control signal, the SR flip-flop can be switched between the set logic priority and the reset logic priority.

Yet another embodiment of the present invention relates to a test apparatus. The test apparatus comprises: a waveform data generating unit configured to generate waveform data which defines a test pattern signal to be supplied to a device under test; and a waveform generating unit configured to receive the waveform data, and to generate the test pattern signal. The waveform generating unit comprises: an edge generating unit configured to generate, based upon the waveform data, a set pulse which is asserted at a positive edge timing of the test pattern signal, and to generate a reset pulse which is asserted at a negative edge timing of the test pattern signal; and an SR flip-flop according to any one of the aforementioned embodiments, configured to switch its output level according to the set pulse and the reset pulse so as to generate the test pattern signal.

It should be noted that any combination of the aforementioned components may be made, and any component of the present invention or any manifestation thereof may be mutually substituted between a method, an apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3 is a truth table for the SR flip-flop shown in FIG. 1;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, or that does not damage the functions or effects of the connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, or that does not damage the functions or effects of the connection therebetween, in addition to a state in which the member A is directly connected to the member C, or the member B is directly connected to the member C.

[First Embodiment]

Figure 1:
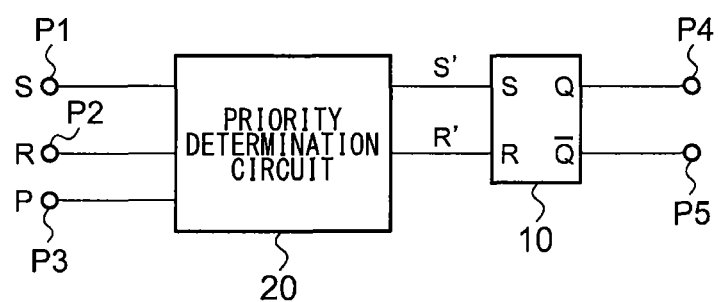
FIG. 1 is a block diagram which shows a configuration of an SR flip-flop according to a first embodiment.

FIG. 1 is a block diagram which shows a configuration of an SR flip-flop 100 according to a first embodiment. The SR flip-flop 100 includes an input set terminal P1, an input reset terminal P2, a control terminal P3, an output terminal P4, an inverting output terminal P5, an input priority determination circuit 20, and an output SR flip-flop 10.

The SR flip-flop 100 is configured to receive a set signal S and a reset signal R, and to generate an output signal Q which is set to a first level when the set signal S is asserted, and which is set to a second level when the reset signal R is asserted.

In the positive logic system, the asserted state is represented by the high level, and the negated state is represented by the low level, whereas in the negative logic system, the asserted state is represented by the low level, and the negated state is represented by the high level. The present invention can be applied to either one of the positive logic system or the negative logic system, or otherwise can be applied to a combination of the positive logic system and the negative logic system. A signal obtained by logical inversion of a given signal is indicated by a symbol "B" or "#" appended as a suffix, or otherwise is indicated by a superscript bar. For example, the signals indicated by "SB" or "#S" each represent a signal obtained by logical inversion of the signal S.

A set signal S is input to the input set terminal P1. A reset signal R is input to the input reset terminal P2. A control signal P is input to the control terminal P3, which is an instruction to switch the mode between the set priority mode and the reset priority mode. For example, the control signal P is switchable between a high level (1) which represents the set priority mode and a low level (0) which represents the reset priority mode.

The input priority determination circuit 20 is configured to receive the set signal S, the reset signal R, and the control signal P, and to generate an intermediate set signal S' and an intermediate reset signal R' according to the signals thus received.

(i) When the set signal S is asserted, and the reset signal R is negated, the input priority determination circuit 20 asserts the intermediate set signal S', and negates the intermediate reset signal R'. (ii) When the set signal S is negated, and the reset signal R is asserted, the input priority determination circuit 20 negates the intermediate set signal S' and asserts the intermediate reset signal R'. (iii) When the control signal P indicates the set priority mode, i.e., when the control signal P is high level when the set signal S and the reset signal R are both asserted, the input priority determination circuit 20 asserts the intermediate set signal S' and negates the intermediate reset signal R'. (iv) When the control signal P indicates the reset priority mode, i.e., when the control signal P is low level when the set signal S and the reset signal R are both asserted, the input priority determination circuit 20 negates the intermediate set signal S' and asserts the intermediate reset signal R'.

The output SR flip-flop 10 is configured to receive the intermediate set signal S' via its set terminal (S), and to receive the intermediate reset signal R' via its reset terminal (R). The output SR flip-flop 10 is configured to: (i) assert the positive logic output Q when the intermediate signal S' is asserted; and (ii) negate the positive logic output when the intermediate reset signal R' is asserted.

Figure 2A:
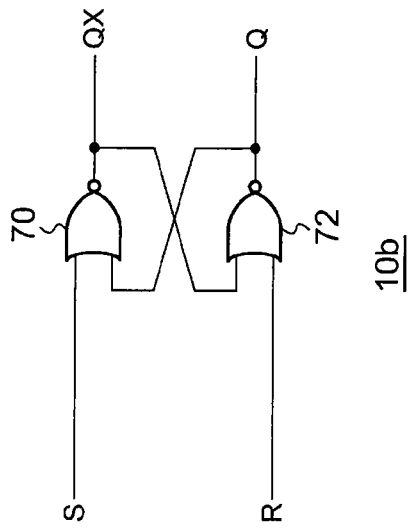
FIGS. 2A through 2D are circuit diagrams each showing an example configuration of an output SR flip-flop which can be employed as the output SR flip-flop shown in FIG. 1.
Figure 2B:
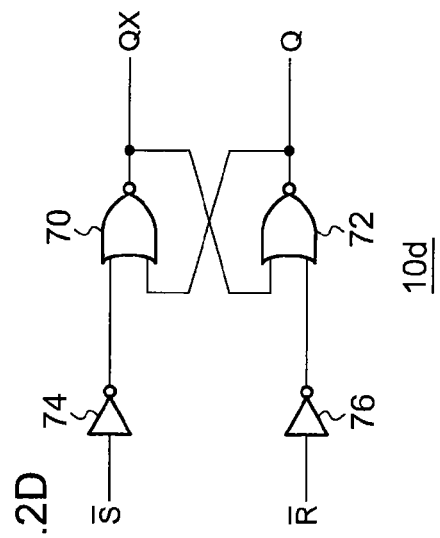

FIGS. 2A through 2D are circuit diagrams each showing an example configuration of an output SR flip-flop 10 which can be employed as the output SR flip-flop 10 shown in FIG. 1. FIGS. 2A and 2B are circuit diagrams each showing an example configuration of an SR flip-flop having a positive logic input configuration. An SR flip-flop 10a shown in FIG. 2A is a so-called NAND SR flip-flop, and includes NAND gates and 62 and inverters 64 and 66. The inverter 64 is configured to invert a signal input to the set terminal (S) of the output SR flip-flop 10a. The inverter 66 is configured to invert a signal input to the reset terminal (R). The NAND gates 60 and 62 are cross-connected to each other. The NAND gate 60 is configured to generate the logical NAND of the output of the inverter 64 and the output of the NAND gate 62. The NAND gate 62 is configured to generate the logical NAND of the output of the inverter 66 and the output of the NAND gate 60.

An output SR flip-flop 10b shown in FIG. 2B is a so-called NOR SR flip-flop, and includes NOR gates 70 and 72. The NOR gates 70 and 72 are cross-connected to each other. The NOR gate 70 is configured to generate the logical NOR of the signal input to the set terminal (S) and the output of the NOR gate 72. The NOR gate 72 is configured to generate the logical NOR of the signal input to the reset terminal (R) and the output of the NOR gate 70.

Figure 2C:
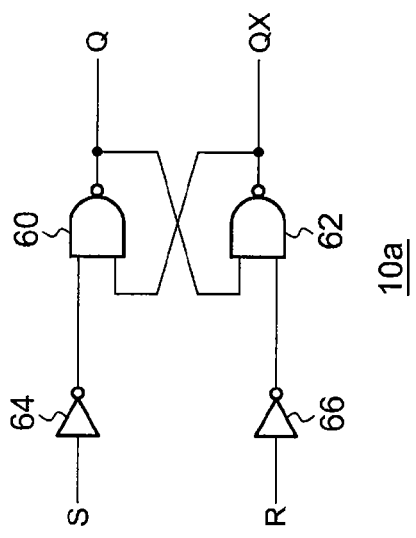
Figure 2D:
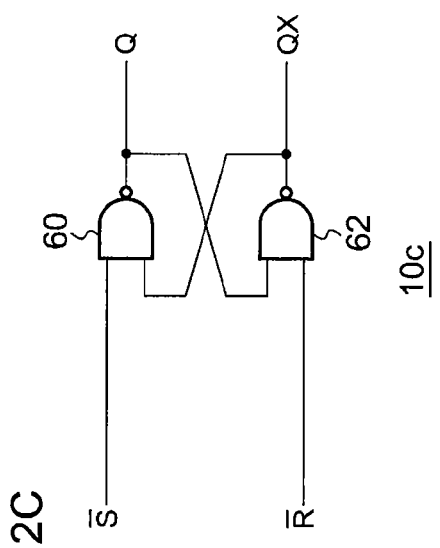

FIGS. 2C and 2D are circuit diagrams each showing an example configuration of an SR flip-flop having a negative logic input configuration. An output SR flip-flop 10c shown in FIG. 2C has a configuration obtained by omitting the inverters 64 and 66 from the configuration of the output SR flip-flop 10a shown in FIG. 2A. An output SR flip-flop 10d shown in FIG. 2D has a configuration obtained by adding inverters 74 and 76 to the configuration of the output SR flip-flop 10b shown in FIG. 2B.

It should be noted that the configuration of the output SR flip-flop 10 is not restricted to such arrangements. Also, other configuration may be employed.

FIG. 3 is a diagram which shows a truth table for the SR flip-flop 100 shown in FIG. 1. The symbol "φ" represents "redundant (don't care)". The truth table shown in FIG. 3 shows a set of truth values in a case in which the set signal S, the reset signal R, the intermediate set signal S', and the intermediate reset signal R' are used in the positive logic system. In FIG. 3, the broken line A indicates the input/output of the input priority determination circuit 20, and the broken line B indicates the input/output of the output SR flip-flop 10.

With the SR flip-flop 100 shown in FIG. 1, the input priority determination circuit 20 is provided as a component upstream of the output SR flip-flop 10. Thus, even if the set signal S and the reset signal R are asserted at the same time, such an arrangement asserts one from among the intermediate set signal S' and the intermediate reset signal R' according to the control signal. As a result, such an arrangement is capable of switching the overall system of the SR flip-flop 100 between the set priority logic system and the reset priority logic system.

Figure 4:
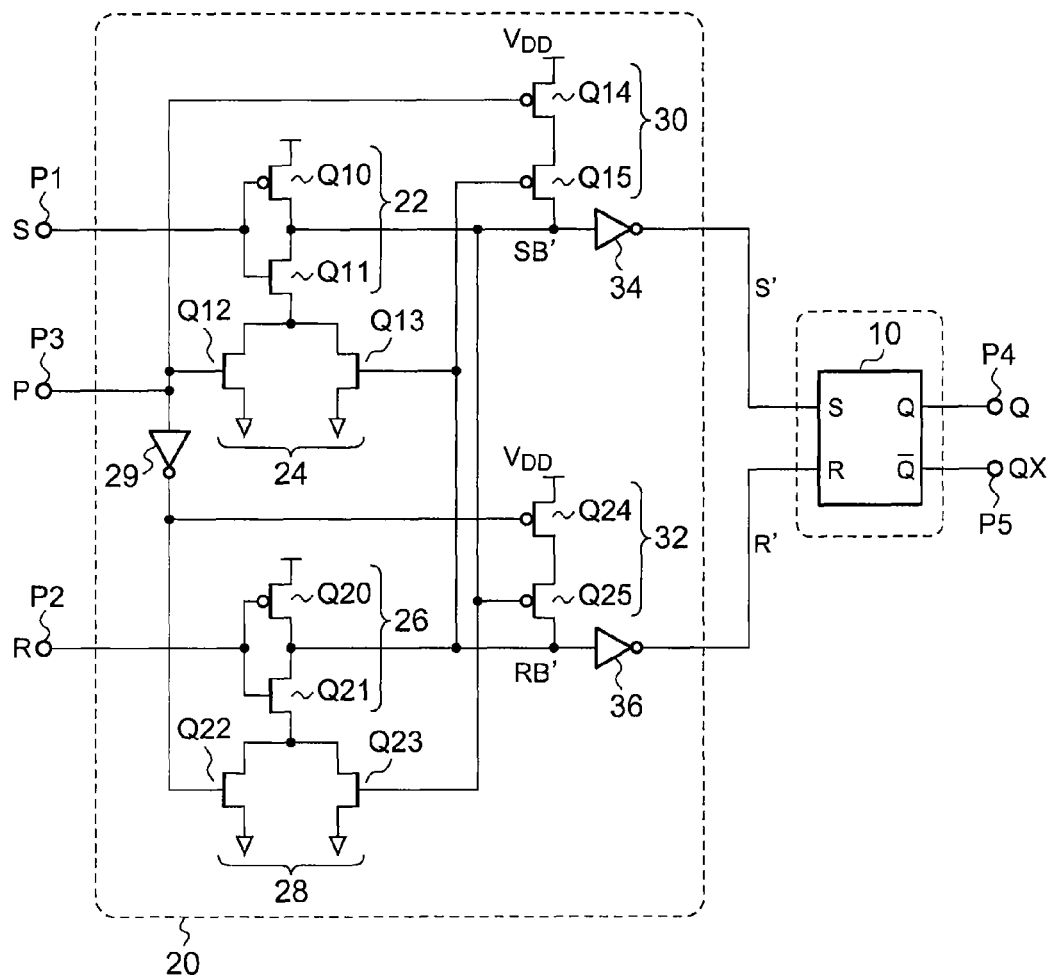
FIG. 4 is a circuit diagram which shows a first example configuration of an SR flip-flop.

FIG. 4 is a circuit diagram which shows a first example configuration of an SR flip-flop.

The input priority determination circuit 20 includes a first inverter 22, a first control unit 24, a second inverter 26, a second control unit 28, a third inverter 29, a first pull-up circuit 30, a second pull-up circuit 32, a fourth inverter 34, and a fifth inverter 36.

The output SR flip-flop 10 shown in FIG. 4 has a positive logic input configuration.

The first inverter 22 includes transistors Q10 and Q11, and is configured to invert the set signal S input to the input set terminal P1. The second inverter 26 includes transistors Q20 and Q21, and is configured to invert the reset signal R input to the input reset terminal P2. The third inverter 29 is configured to invert the control signal P.

The first control unit 24 is configured to switch the state of the first inverter 22 between the active state and the inactive state. For example, the first control unit 24 is configured as a switch arranged on a current path of the first inverter 22. When the control signal P indicates the set priority mode (high level), or when the output RB' of the second inverter 26 is high level, the first control unit 24 turns on the current path of the first inverter 22 so as to set the first inverter 22 to the active state. Otherwise, the first control unit 24 turns off the current path of the first inverter 22 so as to set the first inverter 22 to the inactive state. In the inactive state, the output of the first inverter 22 is high impedance.

For example, the first control unit 24 includes transistors Q12 and Q13 configured as N-channel MOSFETs arranged in parallel between the source of the transistor Q11 and the ground terminal. The control signal P is input to the gate of the transistor Q12, and the output RB' of the second inverter 26 is input to the gate of the transistor Q13. With such an arrangement, when either the control signal P or the output RB' of the second inverter 26 is set to high level, one of either the transistor Q12 or the transistor Q13 is turned on, thereby turning on the first inverter 22.

In the same way, the second control unit 28 is configured to switch the state of the second inverter 26 between the active state and the inactive state. When the control signal P indicates the reset priority mode, or when the output SB' of the first inverter 22 is high level, the second control unit 28 sets the second inverter 26 to the active state. The second control unit 28 includes transistors Q22 and Q23, and has the same configuration as that of the first control unit 24. The output of the third inverter 29 is input to the gate of the transistor Q22.

When the control signal P indicates the reset priority mode (i.e., low level), and the output RB' of the second inverter 26 is low level, the first pull-up circuit 30 pulls up the output SB' of the first inverter 22 to high level (power supply voltage $V_{DD}$). For example, the first pull-up circuit 30 includes P-channel MOSFET transistors Q14 and Q15 arranged in series between the power supply terminal and the first inverter 22. The control signal P is input to the gate of the transistor Q14, and the output RB' of the second inverter 26 is input to the gate of the transistor Q15.

When the control signal P indicates the set priority mode (i.e., high level), and the output SB' of the first inverter 22 is low level, the second pull-up circuit 32 pulls up the output RB' of the second inverter 26 to high level.

The second pull-up circuit 32 has the same configuration as that of the first pull-up circuit 30, and includes transistors Q24 and Q25 which are each a P-channel MOSFET.

The fourth inverter 34 is configured to invert the output SB' of the first inverter 22 so as to generate the intermediate set signal S'. The fifth inverter 36 is configured to invert the output RB' of the second inverter 26 so as to generate the intermediate reset signal R'.

Figures 5A, 5B, 5C:
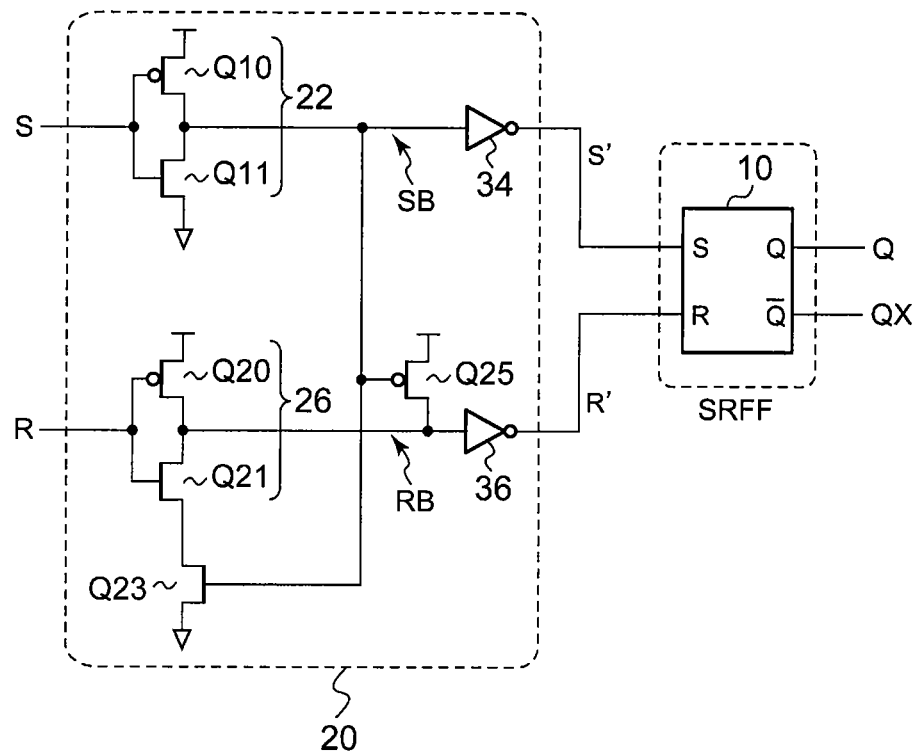
FIG. 5A is an equivalent circuit diagram of the SR flip-flop shown in FIG. 4.
FIG. 5B shows a truth table for when a control signal indicates a set priority mode.
FIG. 5C shows a truth table for when the control signal indicates a reset priority mode.

FIG. 5A is an equivalent circuit diagram of the SR flip-flop 100 shown in FIG. 4 when the control signal P indicates the set priority mode (high level).

With the SR flip-flop 100 shown in FIG. 4, when the control signal P is high level, the transistor Q12 is turned on, the transistors Q22 and Q14 are each turned off, and the transistor Q24 is turned on. FIG. 5B shows a truth table for when the control signal P indicates the set priority mode.

When the reset priority mode is to be selected, the control signal P is set to low level. In this case, the transistor Q12 is turned off, the transistors Q14 and Q22 are each turned on, and the transistor Q24 is turned off. FIG. 5C shows a truth table for when the control signal P indicates the reset priority mode.

By combining the truth tables shown in FIGS. 5B and 5C, the truth table shown in FIG. 3 can be obtained. Thus, the SR flip-flop 100 shown in FIG. 4 is capable of switching its mode between the set priority mode and the reset priority mode according to the control signal P.

Figure 6:
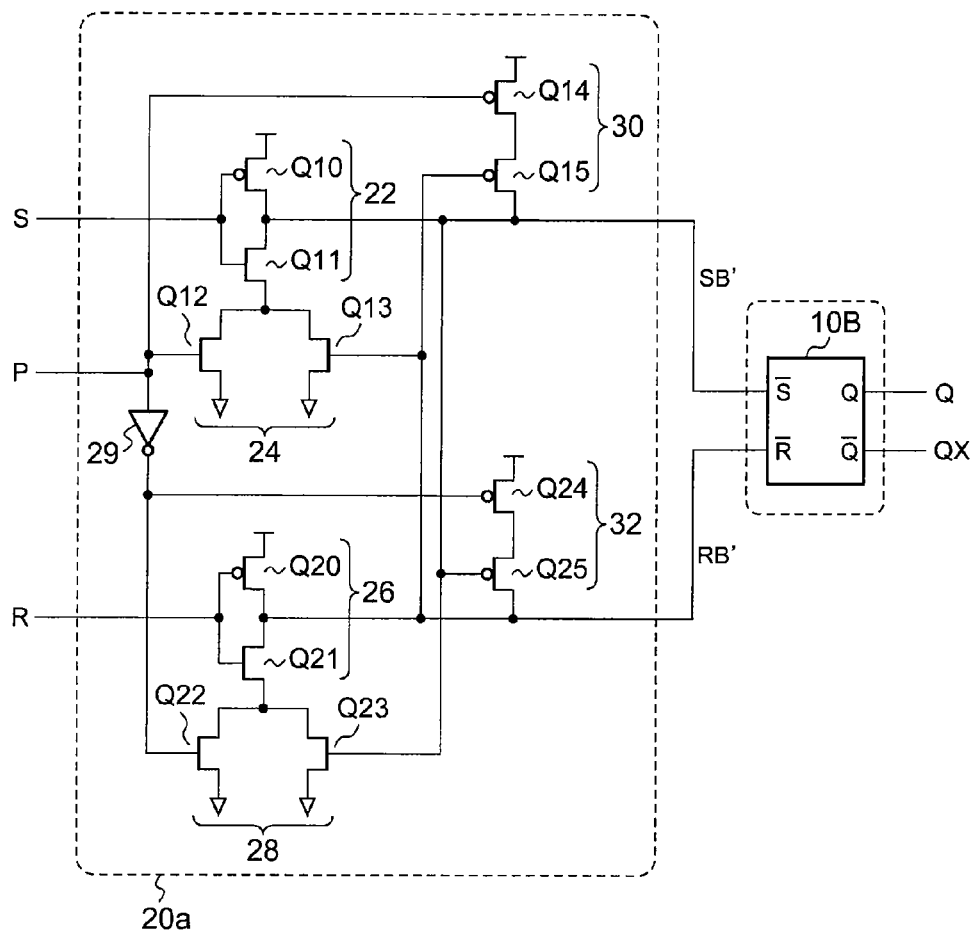
FIG. 6 is a circuit diagram which shows a modification of the SR flip-flop shown in FIG. 4.

FIG. 6 is a circuit diagram which shows a modification of the SR flip-flop shown in FIG. 4. In an SR flip-flop 100a shown in FIG. 6, an output SR flip-flop 10B is configured as an SR flip-flop having a negative logic input configuration as shown in FIGS. 2C and 2D. That is to say, when an intermediate set signal SB' input to the inverting set terminal (#S) is asserted (low level), the output Q is set to high level. When an intermediate reset signal RB' input to the inverting reset terminal (#R) is asserted (low level), the output Q is set to low level. The input priority determination circuit 20a shown in FIG. 6 has a configuration obtained by omitting the fourth inverter 34 and the fifth inverter 36 from the configuration of the input priority determination circuit 20 shown in FIG. 4. The input priority determination circuit 20a is configured to output the output signal SB' of the first inverter 22 and the output signal RB' of the second inverter 26 to the output SR flip-flop 10B.

Figures 7A, 7B:
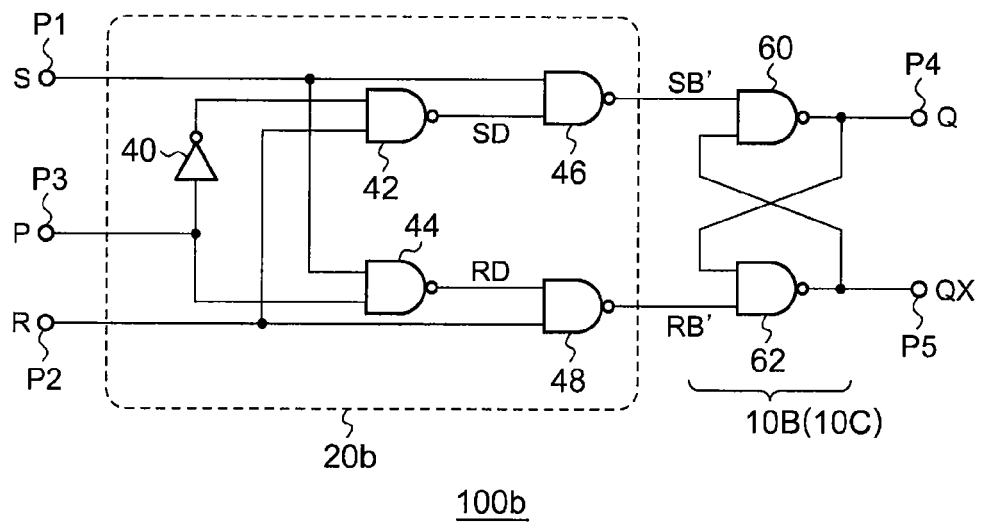
FIG. 7A is a circuit diagram which shows a second example configuration of an SR flip-flop.
FIG. 7B is a truth table for the SR flip-flop shown in FIG. 7A.

FIG. 7A is a circuit diagram which shows a second example configuration of the SR flip-flop. An output SR flip-flop 10B shown in FIG. 7A has a negative logic input configuration. For example, the output SR flip-flop 10c shown in FIG. 2C is employed as such an output SR flip-flop 10B.

An input priority determination circuit 20b includes a sixth inverter 40, a first NAND gate 42, a second NAND gate 44, a third NAND gate 46, and a fourth NAND gate 48.

The sixth inverter 40 is configured to invert the control signal P. The first NAND gate 42 is configured to generate the logical NAND of the reset signal R and the output of the sixth inverter 40. The second NAND gate 44 is configured to generate the logical NAND of the set signal S and the control signal P. The third NAND gate 46 is configured to generate the logical NAND of the set signal S and the output SD of the first NAND gate 42. The fourth NAND gate 48 is configured to generate the logical NAND of the reset signal R and the output RD of the second NAND gate 44.

FIG. 7B shows a truth table for the SR flip-flop 100b shown in FIG. 7A. The SR flip-flop 100b shown in FIG. 7A is also capable of switching its mode between the set priority logic mode and the reset priority logic mode.

Figure 8:
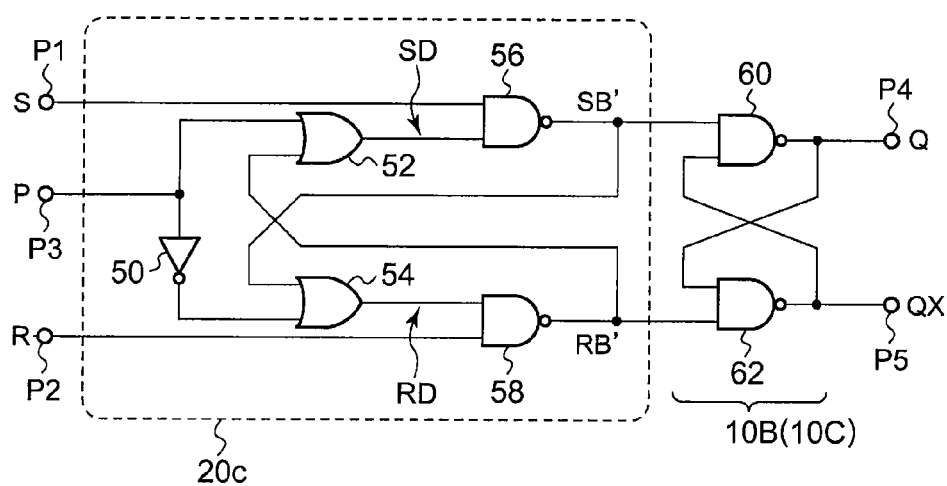
FIG. 8 is a circuit diagram which shows a third example configuration of an SR flip-flop.

FIG. 8 is a circuit diagram which shows a third example configuration of the SR flip-flop. In an SR flip-flop 100c shown in FIG. 8, the output SR flip-flop 10B has a negative logic input configuration. For example, the output SR flip-flop 10c shown in FIG. 2C is employed as such an output SR flip-flop 10B.

An input priority determination circuit 20c includes a seventh inverter 50, a first OR gate 52, a second OR gate 54, a fifth NAND gate 56, and a sixth NAND gate 58.

The seventh inverter 50 is configured to invert the control signal P. The first OR gate 52 is configured to generate the logical OR of the control signal P and the intermediate reset signal RB'. The second OR gate 54 is configured to generate the logical OR of the output of the seventh inverter 50 and the intermediate set signal SB'. The fifth NAND gate 56 is configured to generate the logical NAND of the set signal S and the output SD of the first OR gate 52, and to output the logical NAND thus generated as the intermediate set signal SB'. The sixth NAND gate 58 is configured to generate the logical NAND of the reset signal R and the output RD of the second OR gate 54, and to output the logical NAND thus generated as the intermediate reset signal RB'.

The input priority determination circuit 20c shown in FIG. 8 is also capable of providing an operation represented by the truth table shown in FIG. 7B.

It should be noted that the output SR flip-flop 10B shown in FIG. 7A may be replaced by an SR flip-flop having a positive logic input configuration. In this case, inverters respectively configured to invert the signals SB' and RB' may preferably be arranged as the output stage of the input priority determination circuit 20b. Otherwise, the NAND gates 46 and 48 may preferably be replaced by AND gates.

[Second Embodiment]

Figure 9:
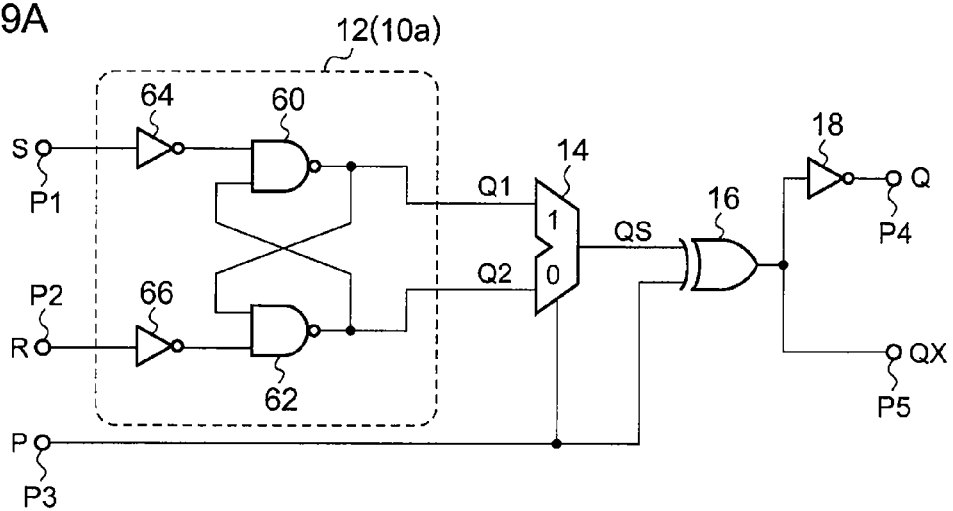
FIG. 9A is a circuit diagram which shows a configuration of an SR flip-flop according to a second embodiment.
FIG. 9B is a truth table for the SR flip-flop shown in FIG. 9A.

FIG. 9A is a circuit diagram which shows a configuration of an SR flip-flop 200 according to a second embodiment. The SR flip-flop 200 includes an input SR flip-flop 12, a selector 14, an EXOR gate 16, and an eighth inverter 18.

The input SR flip-flop 12 is configured as a NAND SR flip-flop having a positive logic input configuration shown in FIG. 2A. The selector 14 is configured to receive the output Q1 and the inverted output Q2 of the input SR flip-flop 12, and to select one of these output signals thus received according to the control signal P. Specifically, when the control signal P is high level, the selector 14 selects the output Q1 of the input SR flip-flop 12, and when the control signal P is low level, the selector 14 selects the inverted output Q2. The EXOR gate 16 is configured to generate the exclusive OR of the output QS of the selector 14 and the control signal P. The eighth inverter 18 is configured to invert the output QX of the EXOR gate 16 so as to generate the output Q.

FIG. 9B shows a truth table for the SR flip-flop 200 shown in FIG. 9A. As shown in FIG. 9B, the SR flip-flop 200 shown in FIG. 9A is also capable of switching its mode between the set priority logic mode and the reset priority logic mode according to the control signal P.

Description has been made above regarding the configuration of the SR flip-flop. Next, description will be made regarding a suitable application of the SR flip-flop 100.

Figure 10:
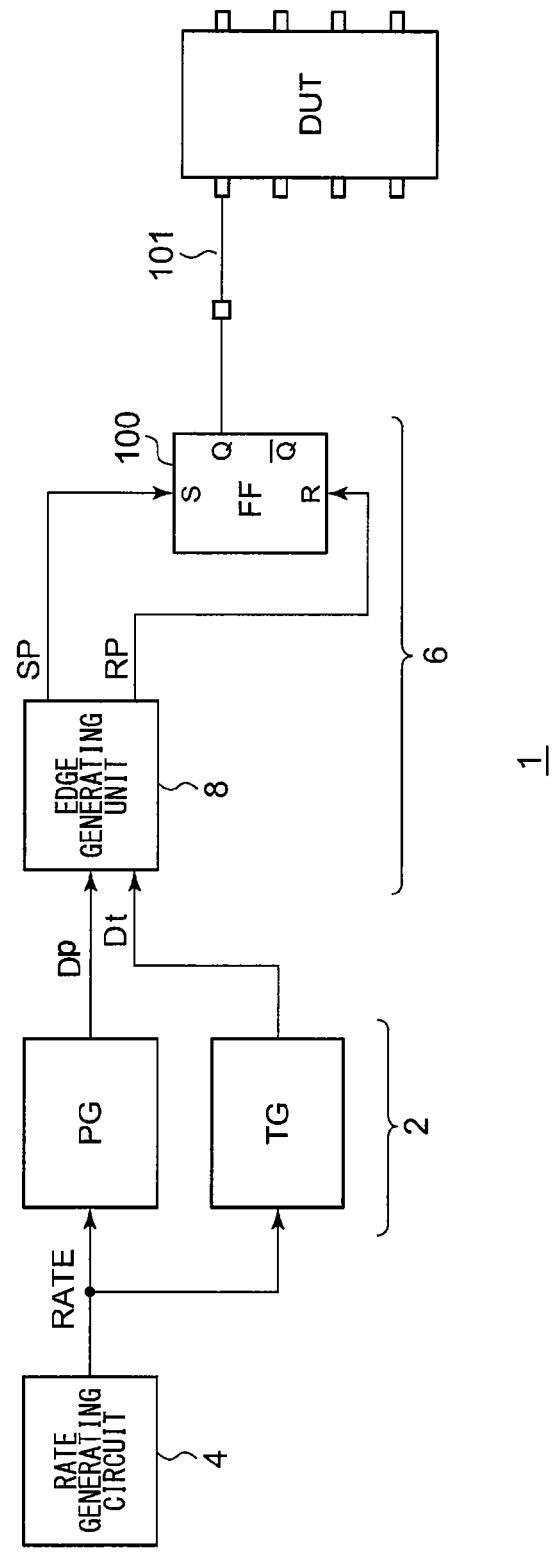
FIG. 10 is a block diagram which shows a configuration of a test apparatus including an SR flip-flop according to an embodiment.

FIG. 10 is a block diagram which shows a configuration of a test apparatus 1 including the SR flip-flop 100 (or otherwise 200). The test apparatus 1 includes a waveform data generating unit 2, a rate generating circuit 4, and a waveform generating unit 6.

The rate generating circuit 4 is configured to generate a rate signal RATE having a predetermined cycle (e.g., a 4-ns cycle). The waveform data generating unit 2 is configured to receive the rate signal RATE, and to generate, in synchronization with this signal, waveform data Dw (not shown) which defines a test pattern signal (bit string) to be supplied to a DUT. Specifically, the waveform data Dw includes pattern data Dp which defines the level (H/L) of each bit of the test pattern signal and timing data Dt which defines the timing of the edge of each bit of the test pattern signal.

The waveform data generating unit 2 includes a pattern generator PG and a timing generator TG. The pattern generator PG is configured to read out the pattern data Dp from pattern memory (not shown) in synchronization with the rate signal RATE. The timing generator TG is configured to read out the timing data Dp from timing memory (not shown) in synchronization with the rate signal RATE.

The waveform generating unit 6 is configured to receive the waveform data Dw, i.e., the pattern data Dp and the timing data Dt. The waveform generating unit 6 is configured to generate a test pattern signal based upon the waveform data Dw.

The waveform generating unit 6 includes an edge generating unit 8 and an SR flip-flop 100. The edge generating unit 8 is configured to generate a set pulse SP and a reset pulse RP based upon the waveform data Dw. The set pulse SP is a signal which is asserted at a positive edge (leading edge) timing of the test pattern signal. The reset pulse is a signal which is asserted at a negative edge (trailing edge) timing of the test pattern signal.

The pattern generator PG, the timing generator TG, and the edge generating unit 8 can be configured using known techniques. Accordingly, detailed description of the configurations thereof will be omitted.

As the SR flip-flop 100, any one of the aforementioned SR flip-flops 100, 100a through 100c, and 200, may be employed.

The SR flip-flop 100 is configured to receive, via its input set terminal (S:P1), the set pulse SP generated by the edge generating unit 8, and to receive, via its input reset terminal (R:P2), the reset pulse RP generated by the edge generating unit 8.

The non-inverted output (Q) of the SR flip-flop 100 transits to high level every time the set pulse SR is asserted (high level), and transits to low level every time the reset pulse RP is asserted. The inverted output (#Q) exhibits the logic level obtained by inverting the non-inverted output Q. The non-inverted output of the SR flip-flop 100 is supplied to the DUT via an unshown driver.

The above is the configuration of the test apparatus 1. Next, description will be made regarding the advantages obtained by applying the SR flip-flop 100 to the test apparatus 1.

Known examples of a test apparatus 1 include a memory tester configured to test memory, a logic tester configured to test a logic circuit, and so forth. Due to design concept differences, in some cases, a set priority SR flip-flop is employed in a memory tester, and a reset priority SR flip-flop is employed in a logic tester, for example. In a case of employing a conventional SR flip-flop in which the input logic priority is fixed to the set priority or otherwise to the reset priority, there is a need to individually design such an SR flip-flop for each kind of tester. This leads to difficulty in providing hardware compatibility.

In contrast, by employing the SR flip-flop 100 according to the embodiment, such an arrangement is capable of switching its mode between the set priority mode and the reset priority mode according to the kind of tester, thereby providing improved hardware compatibility.

While the preferred embodiments of the present invention have been described using specific terms, such description is for illustrative purposes only, and it is to be understood that changes and variations may be made without departing from the spirit or scope of the appended claims.

What is claimed is:

1. An SR flip-flop configured to be capable of switching its logic priority, the SR flip-flop comprising:

an input set terminal configured to receive a set signal as an input signal;

an input reset terminal configured to receive a reset signal as an input signal;

a control terminal configured to receive, as an input signal, a control signal which is an instruction for the SR flip-flop to switch its mode between a set priority mode and a reset priority mode;

an input priority determination circuit configured to receive the set signal, the reset signal, and the control signal, to generate an intermediate set signal and an intermediate reset signal, and to operate such that (i) when the set signal is asserted and the reset signal is negated, the intermediate set signal is asserted, and the intermediate reset signal is negated, (ii) when the set signal is negated and the reset signal is asserted, the intermediate set signal is negated, and the intermediate reset signal is asserted, (iii) when the control signal indicates the set priority mode, and when the set signal and the reset signal are both asserted, the intermediate set signal is asserted, and the intermediate reset signal is negated, and (iv) when the control signal indicates the reset priority mode, and when the set signal and the reset signal are both asserted, the intermediate set signal is negated, and the intermediate reset signal is asserted; and an output SR flip-flop configured to receive the intermediate set signal via its set terminal, to receive the intermediate reset signal via its reset terminal, and to operate such that (i) when the intermediate set signal is asserted, its positive logic output is asserted, and (ii) when the intermediate reset signal is asserted, its positive logic output is negated.

2. An SR flip-flop according to claim 1, wherein the input priority determination circuit comprises:
   a first inverter configured to invert the set signal;
   a second inverter configured to invert the reset signal;
   a first control unit configured to switch the state of the first inverter between an active state and an inactive state, and to operate such that, when the control signal indicates the set priority mode or when the output of the second inverter is high level, the first inverter is set to the active state;
   a second control unit configured to switch the state of the second inverter between an active state and an inactive state, and to operate such that, when the control signal indicates the reset priority mode or when the output of the first inverter is high level, the second inverter is set to the active state;
   a first pull-up circuit configured to pull up the output of the first inverter to high level when the control signal indicates the reset priority mode and the output of the second inverter is low level; and
   a second pull-up circuit configured to pull up the output of the second inverter to high level when the control signal indicates the set priority mode and the output of the first inverter is low level.

3. An SR flip-flop according to claim 2, wherein the output SR flip-flop has a positive logic input configuration,
   and wherein the input priority determination circuit further comprises:
     a fourth inverter configured to invert the output of the first inverter, and to output the signal thus inverted to the set terminal of the output SR flip-flop; and
     a fifth inverter configured to invert the output of the second inverter, and to output the signal thus inverted to the reset terminal of the output SR flip-flop.

4. An SR flip-flop according to claim 2, wherein the output SR flip-flop has a negative logic input configuration,
   and wherein the input priority determination circuit is configured to operate such that the output of the first inverter is output to the set terminal of the output SR flip-flop, and such that the output of the second inverter is output to the reset terminal of the output SR flip-flop.

5. An SR flip-flop according to claim 1, wherein the input priority determination circuit comprises:
   a sixth inverter configured to invert the control signal;
   a first NAND gate configured to generate the logical NAND of the reset signal and the output of the sixth inverter;
   a second NAND gate configured to generate the logical NAND of the set signal and the control signal;
   a third NAND gate configured to generate the logical NAND of the set signal and the output of the first NAND gate; and
   a fourth NAND gate configured to generate the logical NAND of the reset signal and the output of the second NAND gate.

6. An SR flip-flop according to claim 1, wherein the input priority determination circuit comprises:
   a seventh inverter configured to invert the control signal;
   a first OR gate configured to generate the logical OR of the control signal and the intermediate reset signal;
   a second OR gate configured to generate the logical OR of the output of the seventh inverter and the intermediate set signal;
   a fifth NAND gate configured to generate the logical NAND of the set signal and the output of the first OR gate; and
   a sixth NAND gate configured to generate the logical NAND of the reset signal and the output of the second OR gate.

7. An SR flip-flop according to claim 5, wherein the output SR flip-flop has a negative logic input configuration.

8. An SR flip-flop according to claim 6, wherein the output SR flip-flop has a negative logic input configuration.

9. A test apparatus comprising:
   a waveform data generating unit configured to generate waveform data which defines a test pattern signal to be supplied to a device under test; and
   a waveform generating unit configured to receive the waveform data, and to generate the test pattern signal,
   wherein the waveform generating unit comprises:
     an edge generating unit configured to generate, based upon the waveform data, a set pulse which is asserted at a positive edge timing of the test pattern signal, and to generate a reset pulse which is asserted at a negative edge timing of the test pattern signal; and
     an SR flip-flop according to claim 1, configured to switch its output level according to the set pulse and the reset pulse so as to generate the test pattern signal.

10. An SR flip-flop configured to be capable of switching its logic priority, the SR flip-flop comprising:
    an input set terminal configured to receive a set signal as an input signal;
    an input reset terminal configured to receive a reset signal as an input signal;
    a control terminal configured to receive, as an input signal, a control signal which is an instruction for the SR flip-flop to switch its mode between a set priority mode and a reset priority mode;
    an input SR flip-flop configured to receive the set signal via its set terminal, and to receive the reset signal via its reset terminal;
    a selector configured to select one from among an output signal and an inverted output signal of the SR flip-flop according to the control signal;
    an EXOR gate configured to generate the exclusive OR of the output of the selector and the control signal; and
    an eighth inverter configured to invert the output of the EXOR gate.

11. A test apparatus comprising:
    a waveform data generating unit configured to generate waveform data which defines a test pattern signal to be supplied to a device under test; and
    a waveform generating unit configured to receive the waveform data, and to generate the test pattern signal,
    wherein the waveform generating unit comprises:
      an edge generating unit configured to generate, based upon the waveform data, a set pulse which is asserted at a positive edge timing of the test pattern signal, and to generate a reset pulse which is asserted at a negative edge timing of the test pattern signal; and
      an SR flip-flop according to claim 9, configured to switch its output level according to the set pulse and the reset pulse so as to generate the test pattern signal.

12. A test apparatus comprising:
    a waveform data generating unit configured to generate waveform data which defines a test pattern signal to be supplied to a device under test; and
    a waveform generating unit configured to receive the waveform data, and to generate the test pattern signal,
    wherein the waveform generating unit comprises:

an edge generating unit configured to generate, based upon the waveform data, a set pulse which is asserted at a positive edge timing of the test pattern signal, and to generate a reset pulse which is asserted at a negative edge timing of the test pattern signal; and an SR flip-flop configured to be capable of switching its logic priority according to a control signal which is an instruction for the SR flip-flop to switch its mode between a set priority mode and a reset priority mode and to switch its output level according to the set pulse and the reset pulse so as to generate the test pattern signal.

* * * * *